Oct. 3, 1961 G. L. CLAPPER 3,003,069

SIGNAL TRANSLATING APPARATUS

Filed Sept. 4, 1956

INVENTOR.
GENUNG L. CLAPPER

BY

Dewey J. Cunningham

ATTORNEY

3,003,069
SIGNAL TRANSLATING APPARATUS

Genung L. Clapper, Vestal, N.Y., assignor to International Business Machines Corporation, New York, N.Y., a corporation of New York Filed Sept. 4, 1956, Ser. No. 607,666
5 Claims. (Cl. 307—88.5)

The present invention relates to signal translating apparatus, and particularly to a new and improved bistable device utilizing transistors.

Bistable devices are basic to all types of digital computers. They are of many types and are commonly referred to as multivibrators, triggers, latches, flip-flops, etc. Such a device normally utilizes two halves of a twin-triode vacuum tube and is characterized by the fact that there are two plate-to-grid couplings and a common bias arrangement between the two halves. This coupling and bias arrangement causes the circuit as a whole to remain in either one of its stable states until the application of a signal which changes it to the other. With the advent of junction type transistors, an analogous bistable circuit was constructed. In this circuit, each of two transistors was connected in a grounded emitter configuration with its collector connected through a resistor to a first source of potential and its base connected through a resistor to a second source of potential. A cross-coupling arrangement was furnished between the collector of each transistor and the base of the other so as to cause the circuit to remain in either one of its stable states until the application of a signal which changes it to the other.

In a bistable device employing transistors as described above, a disadvantage arises in the use of transistors connected in the grounded emitter configuration. Such a circuit is inherently slow in operation due to the problem of minority carrier storage. In a grounded emitter circuit, the total base current is the difference between the emitter and collector currents. This difference is quite small for most transistors, being approximately two percent of the emitter current. Thus the transistor may exhibit current amplification properties and be driven from a relatively high impedance source. However, if the driving current applied to the base is very large, the collector will saturate. Where saturation occurs, the positive feedback mechanism for adjusting the collector and emitter currents is not operative and all remaining base current must flow through the emitter. The elimination of the excess minority carriers takes an appreciable time to accomplish, during which time the transistor is held in a conductive state, thereby limiting the frequency response of the circuit as a whole.

In the present invention, the grounded emitter connection for a transistor is avoided and an emitter follower output is provided. Briefly, the bistable device of this invention comprises a first junction type transistor which is connected in a modified grounded base configuration, the arrangement being such that an input signal at the base can go above a particular potential but not below it. The emitter of the first transistor is connected to the midpoint of a voltage divider having one end connected to a first source of D.C. potential. The collector of the first transistor is connected through a resistor to a second source of D.C. potential and directly to the base of a second transistor which is connected in a grounded collector configuration. The second transistor has its emitter connected to the other end of the previously mentioned voltage divider. Only one of the transistors is allowed to fully conduct at one time.

A Set signal may be applied to the base of the first transistor to cause the bistable device to turn On and a Reset signal may be applied to the base of the second transistor to cause the bistable device to turn Off. In another embodiment of the bistable device a feedback arrangement is provided between the emitter of the second transistor and the base of the first transistor so as to bias the first transistor in a manner such that it will be in a position to quickly change its conductive state when the bistable device is changing states.

Accordingly, it is an object of the present invention to provide a new and improved bistable device utilizing transistors.

Another object of this invention is to furnish a new and improved bistable device employing transistors where the transistors are not connected in a grounded emitter configuration.

Still another object of the present invention is to furnish a bistable device employing transistors which does not require balanced transistors.

Another object of the invention is to produce a high speed bistable device employing two junction type transistors in which one of said transistors is connected in a grounded collector configuration to afford an output having good drive characteristics.

Still another object of the invention is to furnish in a bistable device, a first feedback path for maintaining the bistable device in its present state and a second feedback path for preparing the bistable device for a change in state.

A further object of the invention is to produce a new and improved trigger circuit which does not load the input source.

Other objects of the invention will be pointed out in the following description and claims and illustrated in the accompanying drawings, which disclose, by way of examples, the principle of the invention and the best mode, which has been contemplated, of applying that principle.

Figure 1:
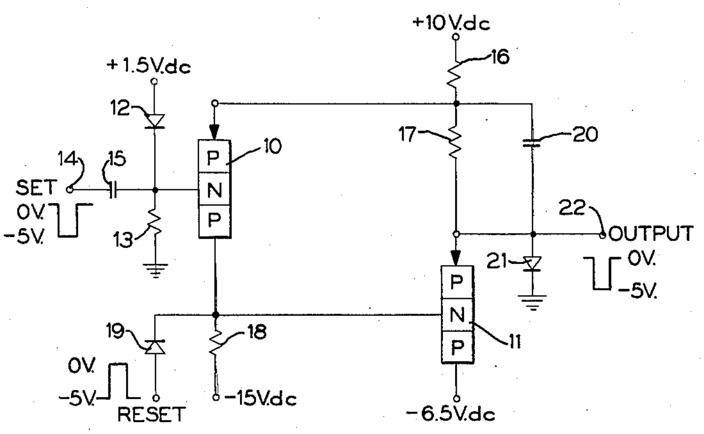
FIG. 1 is a schematic diagram of a first form of the invention.

Referring to FIG. 1, the trigger circuit illustrated comprises two PNP junction type transistors which are illustrated by reference numerals 10 and 11.

As utilized in the drawings, the emitter of a PNP transistor is shown in the form of an arrow which is pointing toward the upper P-type region. The collector of the transistor is connected to the lower P-type region and the base is always connected to the center N-type region. Transistor 10 is connected in a modified grounded base configuration in that its base is connected to the cathode of a diode 12 whose plate is connected to a particular source of D.C. potential. The base of transistor 10 is also connected by way of a resistor 13 to ground. The Set signal is adapted to be supplied to terminal 14 and coupled by way of capacitor 15 to the base of transistor 10. As illustrated, the Set signal is a pulse which comprises a negative-going leading edge which goes from ground to —5 volts and a positive-going trailing edge which returns from —5 volts to ground. It will be appreciated that as the Set signal goes from ground to —5 volts, capacitor 15 will be allowed to charge since the base of transistor 10 is not allowed to go below +1.5 volts because of diode 12. That is, as soon as the base of transistor 10 attempts to go below +1.5 volts, diode 12 begins to conduct and prevents the base from going below the plate potential of the diode. However, as soon as the Set signal rises back to ground, a positive-going voltage will appear at the base of transistor 10. It is this positive-going voltage which is utilized to place transistor 10 out of conduction.

The emitter of transistor 10 is connected to a point intermediate resistors 16 and 17 which form a voltage divider between a positive source of D.C. potential and the emitter of transistor 11. The collector of transistor 10 is connected directly to the base of transistor 11 and by way of a resistor 18 to a negative source of D.C. potential.

In the circuit shown in FIG. 1, the device is normally considered to be Off with transistor 10 conducting and transistor 11 not conducting. Thus with transistor 10 conducting, the collector thereof will be at approximately +1.5 volts above ground potential. Under these circumstances, transistor 11 will be non-conducting since the emitter to base connection is reverse biased. As soon as the positive-going trailing edge of the Set signal produces the positive-going transient at the base of transistor 10, the emitter to base connection of this transistor will be reverse biased and the transistor will go out of conduction, thereby allowing the collector voltage to drop toward the negative source of D.C. potential to which the lower end of resistor 18 is connected. The collector is limited in the negative-going direction by the Reset line which at this time is normally at −5 volts D.C. It is seen that the Reset line is connected to the plate of a diode 19 whose cathode is connected to the collector of cathode 10. Thus when the collector attempts to go below −5 volts, the diode 19 conducts and prevents such action.

When the collector of transistor 10 drops sufficiently, the emitter to base potential difference in transistor 11 will be sufficient to allow transistor 11 to conduct, thereby causing the emitter voltage of transistor 11, which had been at approximately ground potential, to drop to −5 volts. When the emitter of transistor 11 drops to −5 volts, the midpoint of the divider between resistors 16 and 17 also drops proportionally. A high frequency bypass capacitor 20 is arranged in parallel with resistor 17 to speed the dropping action. The arrangement is such that before capacitor 15 can discharge sufficiently to lower the base potential of transistor 10 to allow it to go back into conduction, the midpoint of the divider drops sufficiently to prevent transistor 10 from going back into conduction. Thus transistor 10 is biased in its nonconductive state by the conducting action in transistor 11.

It is seen that the emitter of transistor 11 is connected to the plate of a diode 21, the cathode of said diode being connected to ground potential. This diode serves to limit the upper voltage level of the emitter. That is, if the emitter attempts to go above ground potential, diode 21 will conduct and prevent such action. An output may be taken from terminal 22 and will be in the form of a voltage which goes from ground to −5 volts, the leading edge thereof being coincident with the positive-going trailing edge of the Set pulse.

In order to reset the trigger, it is only necessary to apply a positive-going pulse to the plate of diode 19. This pulse, which goes from −5 volts to ground, as shown in FIG. 1, causes the base of transistor 11 to go sufficiently positive to reverse bias the emitter to base connection of transistor 11. When this occurs, the emitter of transistor 11 rises to ground and allows the midpoint between resistors 16 and 17 to also rise sufficiently to place the emitter of transistor 10 at a potential sufficiently above the base potential thereof to allow transistor 10 to go into conduction. As transistor 10 goes into conduction, its collector, which is already at ground, will rise to 1.5 volts above ground and bias transistor 11 for continued nonconduction.

In a modified form of the invention shown in FIG. 2, the circuit is quite similar to that shown in FIG. 1 but the entire circuit will be described in detail. The FIG. 2 circuit utilizes two PNP junction type transistors 30 and 31. Transistor 30 is connected as a modified grounded base amplifier, the base being connected to the cathode of a diode 32 whose plate is connected to a positive source of D.C. potential. The base of transistor 30 is also connected to the upper end of a resistor 33, the lower end of said resistor being connected to the emitter of transistor 31. A Set input signal is adapted to be applied to terminal 34, this Set input signal having a leading edge which goes from ground potential to −5 volts and a trailing edge which returns to ground. As in the circuit shown in FIG. 1, the Set signal is applied to terminal 34 and coupled by way of a capacitor 35 to the base of transistor 30. The emitter of transistor 30 is connected to a point intermediate resistors 36 and 37 which form a divider between a positive source of D.C. potential and the emitter of transistor 31. The collector of transistor 30 is connected directly to the base of transistor 31 and by way of a resistor 38 to a negative source of D.C. potential which is also connected to the collector of transistor 31.

With transistor 30 conducting and transistor 31 out of conduction, the emitter of transistor 31 will be at approximately ground potential, the lower end of the resistor 33 being also at this potential. When the Set input signal goes from ground to −5 volts, an effort is made to lower the base of transistor 30 below +1.5 volts. However, due to the fact that diode 32 is biased for conduction in a forward direction, the base of transistor 30 will not drop below +1.5 volts. When the trailing edge of the Set signal goes from −5 volts to ground, a positive-going transient is applied to the base of transistor 30 and causes transistor 30 to go out of conduction. As transistor 30 goes out of conduction, the collector potential drops toward the negative source of potential connected to the lower end of resistor 38. This results in a low impedance path between the emitter and base of transistor 31, causing transistor 31 to go into conduction.

As transistor 31 goes into conduction, its emitter drops from +0.3 volt to approximately −4.8 volts. The drop in voltage at the emitter of transistor 31 results in a drop in voltage at the emitter of transistor 30, the drop in voltage being made more rapid by the use of a high frequency bypass capacitor 40 in parallel with resistor 37. By dropping the voltage at the emitter of transistor 30, this transistor is biased to remain in a nonconductive state.

Figure 2:
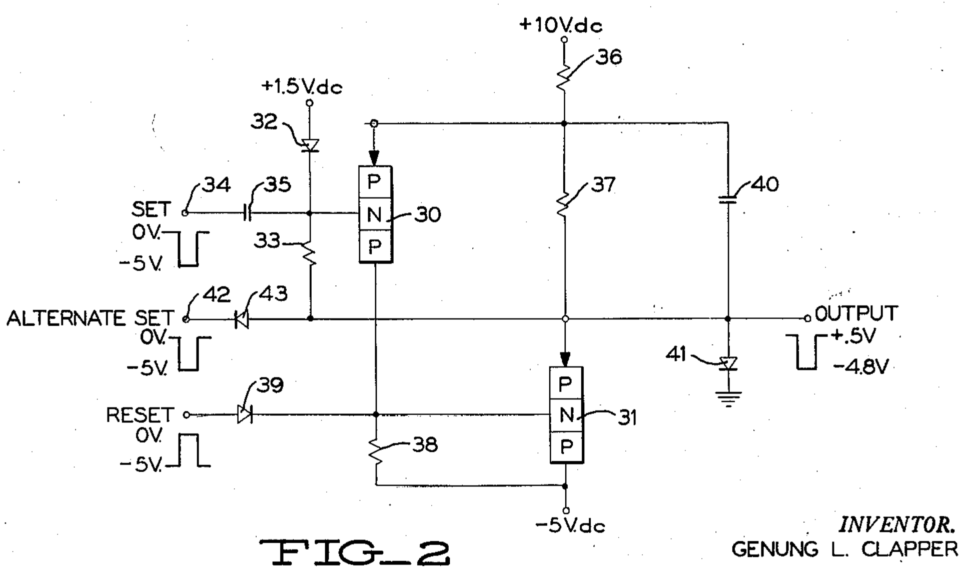
FIG. 2 is a schematic diagram of a modified form of the invention.

The action in the circuit shown in FIG. 2 differs from that shown in FIG. 1 in that in the FIG. 2 circuit, the lower end of resistor 33, which is connected to the emitter of transistor 31, is placed at approximately −4.8 volts when transistor 31 goes into conduction. This contrasts with the FIG. 1 circuit where the lower end of resistor 13 remained at ground potential. In the FIG. 2 circuit, lowering of the voltage at the lower end of resistor 33 results in a more rapid discharge of capacitor 35, thereby returning the base of transistor 30 to a point such that when the trigger is turned Off, the base of transistor 30 will be returned to a point sufficient to allow the transistor 30 to rapidly go into conduction.

In order to turn the trigger Off, a Reset signal, having a leading edge which goes from −5 volts to ground, is applied to the plate of the diode 39 whose cathode is connected to the base of transistor 31. This positive-going voltage results in reverse biasing the emitter to base connection of transistor 31 and causes it to go out of conduction. As transistor 31 goes out of conduction, its emitter rises toward +0.3 volt and results in a rise in voltage at the emitter of the transistor 30. Since the base of transistor 30 has aready returned to a potential below the present voltage of the emitter, transistor 30 goes rapidly into conduction. This, of course, results in a rise in collector voltage of transistor 30 and maintains a bias at the base of transistor 31 to keep it in a nonconducting condition.

As shown in FIG. 2, an Alternate Set input signal may be applied to terminal 42, this terminal being connected to the cathode of a diode 43 whose plate is connected to the emitter of transistor 31. Under these circumstances, instead of turning transistor 30 off by a positive-going voltage to the base, a negative-going voltage in the form of the Alternate Set signal drops the emitter of transistor 30 and biases it for nonconduction. Of course, as soon as transistor 30 goes out of conduction, the collector voltage thereof drops and causes transistor 31 to go into conduction.

Diode 41 is arranged with its plate connected to the emitter of transistor 31 and its cathode connected to ground. Under these circumstances, it serves to limit the upper level of the emitter of transistor 31. It will be understood that the reason that the emitter of transistor 31 is allowed to go to 0.3 volt rather than ground is due to a voltage drop of approximately one-third volt across diode 41 when the diode is conducting.

The present invention may be used in many different circuit configurations. One example of the use of this invention is in a ring circuit such as is used for commutating purposes. A ring circuit would employ a plurality of the triggers arranged in cascade such that the output of one trigger would serve as the input to the next trigger. The Reset signal could be in the form of the basic sync which is applied to all of the triggers simultaneously as the "advance" pulse. The Set input to the first trigger in the ring could be received from the last or any other trigger in the ring. In using the FIG. 2 embodiment of the invention, it is possible to connect them in the manner described above but in addition, the plates of diodes 32 may be connected through a common resistor to a source of potential higher than the illustrated +1.5 volts D.C. The value of the common resistor could be chosen such that when more than one stage of the ring attempts to go On, the voltage at the plates of the diodes would drop below +1.5 volts and allow only the stage actually receiving an input signal to go On. The Alternate Set signal could be supplied to any trigger in the ring and the ring would be reset such that only the stage receiving the Alternate Set signal would be On.

The particular use of PNP junction type transistors in the circuits described is by way of example only. It will be understood by those persons familiar with the art to which the present invention pertains that NPN transistors may be substituted for PNP transistors, the only other changes required being a reversal in polarity of the reference voltages and the various signals used.

From the above-detailed description, it will be evident that there is provided a trigger which is characterized by a lack of the grounded emitter connection and thereby affords high speed operation. The PNP transistors 10 and 30 are connected in a grounded base amplifier configuration such that they afford amplification to the input signal. The transistors 11 and 31 are connected in a grounded collector configuration and serve as emitter followers to thereby provide good drive characteristics to the device receiving an output therefrom. The arrangement is such that balanced transistors are not required. Furthermore, the input source to the triggers is not loaded thereby. As shown in FIG. 2, separate feedback paths are provided from transistor 31 to transistor 30, the first of said paths biasing transistor 30 so as to maintain a nonconductive state and the second feedback path being utilized to discharge capacitor 35 so that the base of transistor 30 will return to a potential such that as soon as transistor 31 starts to go out of conduction, transistor 30 will be allowed to go rapidly into conduction.

While there have been shown and described and pointed out the fundamental novel features of the invention as applied to a preferred embodiment, it will be understand that various omissions and substitutions and changes in the form and details of the device illustrated and in its operation may be made by those skilled in the art, without departing from the spirit of the invention. It is the intention, therefore, to be limited only as indicated by the scope of the following claims.

What is claimed is:

1. A multistable stage adapted for a ring trigger and comprising, a first transistor having emitter, base and collector electrodes and arranged as an inverted amplifier having a grounded base configuration, a second transistor having emitter, base and collector electrodes and arranged as an emitter follower, a common impedance connecting the emitters of said transistors to a source of potential whereby saturation of said inverter amplifier is prevented, a direct current connection for coupling the collector of said inverter amplifier to the base of said emitter follower, a first source of input signals, a capacitor connected to the base of said inverter amplifier and responsive to an input signal from said first signal source to change the conductive states of said transistors whereby said stage is turned on, a second source of input signals, and a diode connected to the base of said emitter follower and responsive to an input signal from said second signal source to change the conductive states of said transistors whereby said stage is turned off.

2. A multistable stage as defined in claim 1 and including feedback circuit means connecting the emitters of said transistors for latching said stage in either its on or off state.

3. A multistable stage adapted for a ring trigger and comprising, a first transistor having emitter, base and collector electrodes and arranged as an inverter amplifier having a grounded base configuration, a second transistor having emitter, base and collector electrodes and arranged as an emitter follower, a common impedance connecting the emitters of said transistors to a source of potential whereby saturation of said inverter amplifier is prevented, a direct current connection for coupling the collector of said inverter amplifier to the base of said emitter follower, a first source of input signals, a capacitor connected to the base of said inverter amplifier and responsive to an input signal from said first signal source to turn said stage on whereby said inverter amplifier is rendered non-conductive and said emitter follower is rendered conductive, a second source of input signals, and a diode connected to the base of said emitter follower and responsive to an input signal from said second signal source to turn said stage off whereby said inverter amplifier is rendered conductive and said emitter follower is rendered non-conductive.

4. A multistable stage adapted for a ring trigger and comprising, a first transistor having emitter, base and collector electrodes and arranged as an inverter amplifier having a grounded base configuration, a second transistor having emitter, base and collector electrodes and arranged as an emitter follower, a common resistor connecting the emitters of said transistors to a source of potential whereby saturation of said inverter amplifier is prevented, a direct current connection for coupling the collector of said inverter amplifier to the base of said emitter follower, a source of bias potential, a second resistor connecting said bias potential source with said direct current connection, a first source of input signals, a capacitor connected to the base of said inverter amplifier and responsive to an input signal from said first signal source to change the conductive states of said transistors whereby said stage is turned on, a second source of input signals, a diode connected to the base of said emitter follower and responsive to an input signal from said second signal source to change the conductive states of said transistors whereby said stage is turned off, and a feedback circuit connecting the emitters of said transistors for maintaining said stage in either its on or off state, said feedback circuit including a resistor in series with said common resistor to provide a voltage divider between said first potential source and said emitters, said inverter amplifier acting as a grounded emitter inverter at the beginning of an input signal transient and as a grounded base inverter upon establishment of said feedback circuit.

5. A multistable stage adapted for a ring trigger and comprising, a first transistor having emitter, base and collector electrodes and arranged as an inverter amplifier having a grounded base configuration, a second transistor having emitter, base and collector electrodes and arranged as an emitter follower, a common impedance connecting the emitters of said transistors to a source of potential whereby saturation of said inverter amplifier is prevented, a direct current connection for coupling the collector of said inverter amplifier to the base of said emitter follower, a first source of input signals, a capacitor connected to the base of said inverter amplifier and responsive to an input signal from said first signal source to change the conductive states of said transistors whereby said stage is turned on, a second source of input signals, a diode connected to the base of said emitter follower and responsive to an input signal from said second signal source to change the conductive states of said transistors whereby said stage is turned off, a first feedback circuit connecting the emitters of said transistors for maintaining said stage in either its on or off state, and a second feedback circuit connecting the emitter of said emitter follower with the base of said inverter amplifier to prepare said stage for a change in state.

References Cited in the file of this patent

UNITED STATES PATENTS

| | | |
|---|---|---|
| 2,459,852 | Summerhayes | Jan. 25, 1949 |
| 2,591,961 | Moore et al. | Apr. 8, 1952 |
| 2,605,306 | Eberhard | July 29, 1952 |
| 2,709,747 | Gordon et al. | May 31, 1955 |
| 2,710,913 | Sherertz | June 14, 1955 |
| 2,825,821 | Logue | Mar. 4, 1958 |
| 2,828,450 | Pinckaers | Mar. 25, 1958 |
| 2,861,258 | Walsh et al. | Nov. 18, 1958 |
| 2,887,542 | Blair et al. | May 19, 1959 |
| 2,903,604 | Henle | Sept. 8, 1959 |